United States Patent
Jang et al.

(10) Patent No.: US 6,479,385 B1
(45) Date of Patent: Nov. 12, 2002

(54) INTERLEVEL DIELECTRIC COMPOSITE LAYER FOR INSULATION OF POLYSILICON AND METAL STRUCTURES

(75) Inventors: Syun-Ming Jang, Hsin-Chu (TW); Chu-Yun Fu, Taipei (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 4 days.

(21) Appl. No.: 09/583,397

(22) Filed: May 31, 2000

(51) Int. Cl.$^7$ .............................................. H01L 21/302
(52) U.S. Cl. ....................... 438/691; 438/142; 438/172; 438/692; 438/693
(58) Field of Search ................................ 438/691, 692, 438/693, 142, 149, 172; 257/390, 635

(56) References Cited

U.S. PATENT DOCUMENTS

| | | | |
|---|---|---|---|
| 5,494,854 A | | 2/1996 | Jain ............................ 437/195 |
| 5,661,093 A | | 8/1997 | Ravi et al. .................. 438/763 |
| 5,665,995 A | * | 9/1997 | Hsue et al. ................. 257/390 |
| 5,716,890 A | | 2/1998 | Yao ............................. 438/624 |
| 5,763,322 A | * | 6/1998 | Hagen et al. ................ 438/632 |
| 5,828,096 A | * | 10/1998 | Ohno et al. .................. 257/306 |
| 5,858,870 A | | 1/1999 | Zheng et al. ................ 438/622 |
| 5,858,876 A | | 1/1999 | Chew .......................... 438/695 |
| 5,880,039 A | | 3/1999 | Lee ............................. 438/763 |
| 5,899,748 A | | 5/1999 | Tsai et al. ................... 438/707 |
| 5,937,323 A | | 8/1999 | Orczyk et al. ............. 438/624 |
| 5,953,635 A | * | 9/1999 | Andideh ..................... 438/761 |
| 6,013,584 A | | 1/2000 | M'Saad ...................... 438/783 |
| 6,214,743 B1 | * | 4/2001 | Oiao et al. .................. 438/723 |

* cited by examiner

*Primary Examiner*—Robert Kunemund
*Assistant Examiner*—Lan Vinh
(74) *Attorney, Agent, or Firm*—George O. Saile; Stephen B. Ackerman

(57) ABSTRACT

A process for forming a composite, interlevel dielectric, (ILD), layer, for MOSFET devices, has been developed. The composite ILD layer is comprised with an underlying, undoped silicon glass layer, providing the material needed to fill the narrow spaces between polysilicon gate structures of the MOSFET devices. A $P_2O_5$ doped, insulator layer, is next formed on the underlying, undoped silicon glass layer, to provide a mobile ion gettering property. An overlying, undoped silicon glass layer is then deposited and subjected to a chemical mechanical polishing procedure, resulting in the desired planar top surface topography, for the composite ILD layer.

14 Claims, 2 Drawing Sheets

INTERLEVEL DIELECTRIC COMPOSITE LAYER FOR INSULATION OF POLYSILICON AND METAL STRUCTURES

BACKGROUND OF THE INVENTION (1) Field of the Invention

The present invention relates to methods used to fabricate semiconductor devices, and more specifically to a method used to form a composite insulator layer to fill gaps between conductive structures, without charge generation of underlying layers.

(2) Description of Prior Art

The emergence of micro-miniaturization, or the ability to fabricate semiconductor devices with sub-micron features, has allowed device performance to be increased, as well the the fabrication costs for a specific semiconductor chip, to be decreased. However the use of sub-micron features can result in process difficulties not encountered with semiconductor devices fabricated with larger features. For example micro-miniaturization has allowed devices to be achieved in which the space, or gap, between polysilicon gate structures, of metal oxide semiconductor field effect transistor, (MOSFET), devices, is in the range of only about 0.18 um. The requirements for interlevel dielectric, (ILD), layers, overlying the polysilicon gate structures are: to fill the narrow, (0.18 um), gap between polysilicon gate structures; to provide a gettering phenomena, that will tie up, or neutralize, deleterious mobile ions; to provide, or to allow, a planar top surface to be realized; and to inherently possess a low charge level, to avoid imparting an unwanted charge on an underlying gate insulator layer.

The above criteria for the optimum ILD layer is difficult to achieve with any specific ILD layer, and so this present invention will describe a process sequence resulting in a composite ILD layer satisfying all the above criteria. An underlying layer, of the composite ILD layer, will supply the needed gap filling property, while a second ILD layer, deposited on the underlying ILD layer, will supply the gettering requirement. The inherent charge level of the gettering layer, as a result of the thickness of the underlying ILD component, is at a distance from the gate insulator layer in which the inherent charge of this layer results in little influence on the underlying gate insulator layer. Finally an overlying ILD layer is used to accept a chemical mechanical polishing, (CMP), procedure, used to provide a planar top surface of subsequent wiring levels. Prior art, such as Yao, in U.S. Pat. No. 5,716,890, describes a composite insulator layer, used to fill gaps between conductive structures, however this prior art uses a barrier layer, covering all surfaces of the conductive structures, prior to forming the composite insulator layer. The present invention, applied to polysilicon gate structures, and thin gate insulator layers, is not designed to accept a barrier layer, but is designed to place the composite insulator layer directly on the polysilicon gate structures, and in the gaps between these structures. In addition that prior art uses a dual gettering layer, resulting in unwanted, increases in process costs.

SUMMARY OF THE INVENTION

It is an object of this invention to form a composite ILD layer overlying conductive structures, as well as overlying and filling the gaps, or spaces, between conductive structures.

It is another object of this invention to use a first layer, of the composite ILD layer, that effectively fills the gaps or spaces, between conductive structures, and is comprised with a charge level at a level low enough not to influence the flatband, and threshold voltage of underlying MOSFET devices.

It is still another object of this invention to deposit a second component of the composite ILD layer, overlying the first, underlying, low charge, gap filling insulator component, with the second component of the composite ILD layer providing a gettering characteristic, used to alleviate the effects of mobile ion charge.

It is still yet another object of this invention to deposit a third component of the composite ILD layer, overlying the second component of the composite ILD layer, for purposes of providing a layer to be subjected to a chemical mechanical polishing procedures, resulting in planarization of the top surface of the composite ILD layer.

In accordance with the present invention a method of forming a composite ILD layer, on underlying MOSFET devices comprised of conductive structures, and comprised of gaps between the conductive structures, wherein the composite ILD layer provides a first layer for the needed gap filling, a second layer for mobile ion gettering, and a third layer for planarization purposes, is described. After formation of polysilicon gate structure, on an underlying gate insulator layer, and after formation of insulator spacers, on the sides of the polysilicon gate structures, and formation of source/drain regions in a region of a semiconductor substrate, not covered by the polysilicon gate structures, a composite ILD layer is deposited. The first, or underlying component of the composite ILD layer, is a high density plasma, undoped silicon glass, (HDP USG), layer, comprised with low charge, and successfully fills the gaps, or spaces, between polysilicon gate structures. A second component of the composite ILD layer is next deposited via high density plasma, or via plasma enhanced chemical vapor deposition, (PECVD), procedures, with the second component of the composite ILD layer comprised with a $P_2O_5$ component, needed to getter mobile ions. An overlying, undoped silicon glass layer, of the composite ILD layer, is next deposited, on the $P_2O_5$ doped, underlying second component, of the composite ILD layer, followed by a chemical mechanical polishing procedure, performed to the overlying, undoped silicon glass layer, resulting in a smooth top surface of the composite ILD layer.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 3:
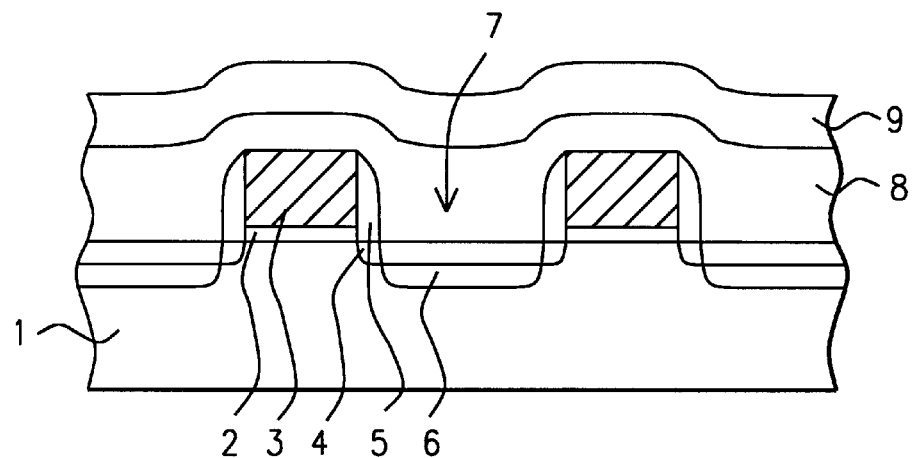

The method of forming a composite ILD layer, on underlying MOSFET devices comprised of conductive structures, and comprised of gaps between the conductive structures, wherein the composite ILD layer provides a first layer for gap filling, a second layer for mobile ion gettering, and a third layer for planarization purposes, is described. A P type, semiconductor substrate 1, comprised of single crystalline silicon, with a <100> crystallographic orientation, is used and schematically shown in FIG. 1. A gate insulator layer 2, comprised of silicon dioxide, at a thickness between about 50 to 200 Angstroms, is thermally grown in an oxygensteam ambient, at a temperature between about 850 to 950° C. A polysilicon layer is next deposited via low pressure chemical vapor deposition, (LPCVD), procedures, to a thickness between about 1000 to 3000 Angstroms. The polysilicon layer can be in situ doped, during deposition, via the addition of arsine, or phosphine, to a silane ambient, or the polysilicon layer can be deposited intrinsically then doped via ion implantation of arsenic or phosphorous ions. Conventional photolithographic and reactive ion etching, (RIE), procedures, are used to define gate structures 3, schematically shown in FIG. 3. If lower word line resistance is desired, gate structure 3, can be a polycide, (metal silicide-polysilicon), structure, comprised of an underlying polysilicon component, and an overlying metal silicide component, such as tungsten silicide. The metal silicide component, as well as the underlying polysilicon component, can be obtained via LPCVD procedures, and defined via photolithographic and RIE procedures. The gap, or space 7, between polysilicon gate structures, can be designed as small as between about 0.16 to 0.20 um, after insulator spacers have been formed on the sides of the gate structures. In addition, although this invention will be shown as a composite ILD layer used between, and overlying, polysilicon gate structures, the composite ILD layer can be formed between, and overlying, metal interconnect structures, again with spaces between the metal interconnect structures as small as 0.18 um.

Figure 1:
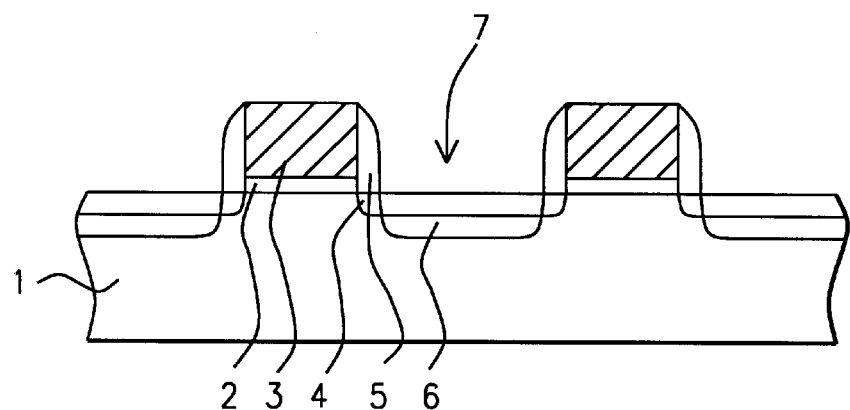
FIGS. 1–5, which schematically, in cross-sectional style, describe key stages of fabrication used to obtain the composite ILD layer.

After removal of the photoresist shape, used for definition of gate structure 3, via plasma oxygen ashing and careful wet cleans, lightly doped source/drain region 4, schematically shown in FIG. 1, is formed via ion implantation of arsenic or phosphorous ions, in a region of semiconductor substrate 1, not covered by gate structures 3. Lightly doped source/drain region 4, is formed using a implant energy between about 10 to 60 KeV, and an implant dose between about 1E12 to 1E14 atoms/cm$^2$. Insulator spacers 5, comprised of either silicon oxide or silicon nitride, shown schematically in FIG. 1 are next formed on the sides of gate structure 3. This is accomplished via deposition of either silicon oxide, or silicon nitride, via LPCVD or via plasma enhanced chemical vapor deposition, (PECVD), procedures, to a thickness between about 800 to 1300 Angstroms. A blanket RE procedure, using $CHF_3$ or $CF_4$ as an etchant, is used to form insulator spacers 5, on the sides of gate structures 3. Heavily doped source/drain region 6, is then formed via ion implantation of arsenic or phosphorous ions, at an energy between about 20 to 70 KeV, at a dose between about 1E14 to 1E16 atoms/cm$^2$.

Figure 2:
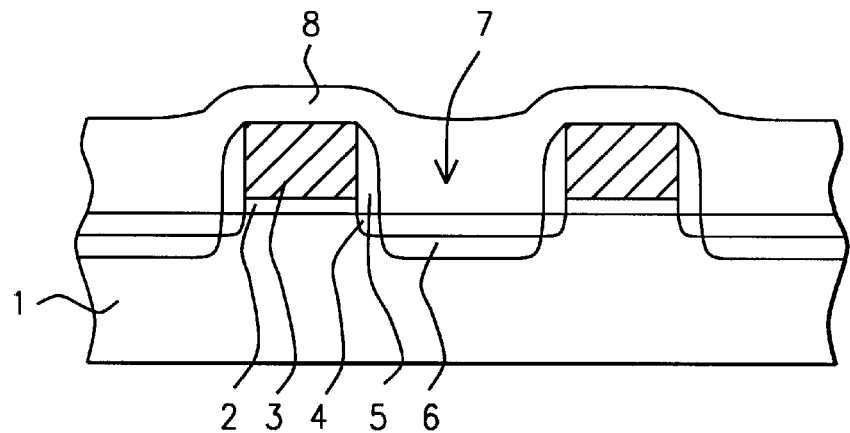

The first component of a composite ILD layer, is next addressed, and shown schematically in FIG. 2. The first desired property of this layer is conformality, or step coverage, allowing narrow space 7, to be successfully filled. A second desired property of the first, or underlying component, of the composite ILD layer, is to be comprised with low fixed charge, therefore not influencing the flatband voltage, or threshold voltage, of the underlying MOSFET devices. For these reasons first insulator layer 8, of a subsequent composite ILD layer, is an undoped silicon glass, (USG), at a thickness between about 1000 to 2000 Angstroms, obtained via a high density plasma, (HDP), deposition procedure, at a temperature between about 500 to 600° C., using silane, ($SiH_4$), and oxygen, as a source. The HDP USG layer 8, inherently provides the needed conformality to fill narrow spaces 7, as shown schematically in FIG. 2. In addition HDP USG layer 8, is formed with a fixed charge level low enough not to deleteriously influence the flatband voltage, ($V_{fb}$), of the MOSFET devices. For example if a $P_2O_5$ doped, HDP layer, comprised with an inherent large negative charge, was used as the underlying layer of the composite ILD layer, the $V_{fb}$, of the MOSFET device would be deleteriously influenced, therefore the undoped HDP layer, providing low charge, and good conformality is used. If desired a thin layer of either silicon oxynitride, or silicon nitride, (not shown in the drawings), can be deposited prior to deposition of HDP USG layer 8, to serve as a contact etch stop. This layer, if desired, would be deposited via plasma enhanced chemical vapor deposition, PECVD), procedures, at a thickness between about 300 to 600 Angstroms.

Another important criteria of the composite ILD layer, is to be comprised with a component layer that will getter, or tie-up, mobile ions, such as $Na^+$, or $K^+$ ions. If these mobile ions are present, they will move through first insulator layer 8, to gate insulator layer, and result in unstable and high charge, adversely influencing the MOSFET threshold voltage. Therefore second insulator 9, shown schematically in FIG. 3, overlying first insulator 8, is formed with either a $P_2O_5$ component, (phosphosilicate glass, PSG), with between about 3 to 7 weight percent phosphorous, (P), in $SiO_2$, or formed with $B_2O_3$ and $P_2O_5$ components, (borophosphosilicate glass, BPSG), where between about 3 to 7 weight percent P and between about 2 to 6 weight percent boron, (B), in $SiO_2$, are used The PSG or BPSG, second insulator 9, is deposited at a thickness between about 2000 to 3000 Angstroms, using a procedure chosen from a group that includes: HDP; atmospheric pressure chemical vapor deposition, (APCVD); sub-atmospheric chemical vapor deposition, (SACVD); or PECVD procedures. Tetraethylorthosilicate, (TEOS), or silane and oxygen, are used as the source for the $SiO_2$ component of second insulator layer 9. This deposition is performed at a temperature between about 450 to 600° C. The negative phosphorous ions, in these layers, will attract and hold, the positive mobile ions that are present, or will be introduced, into the MOSFET dielectric layers. The fixed negative charge, inherent in these second insulator layers, will not adversely influence MOSFET threshold, or flatband voltages, due to the distance between the gate insulator layer and the second insulator layer.

Figure 4:
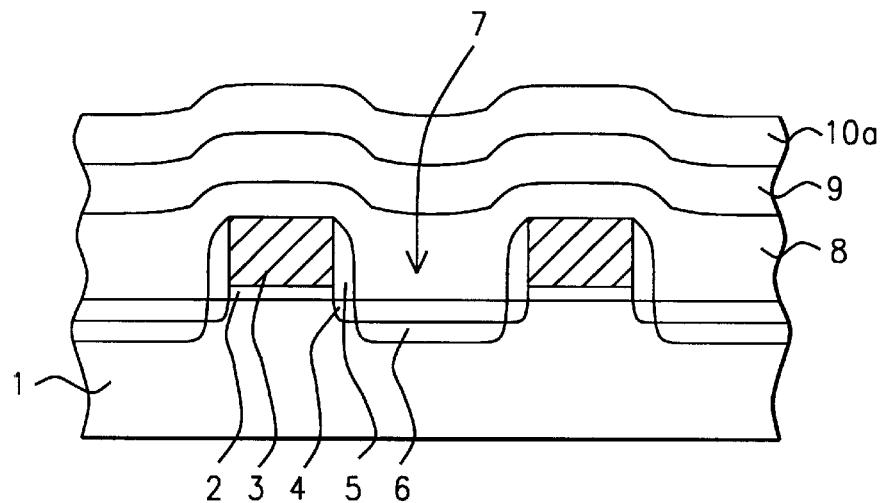
Figure 5:
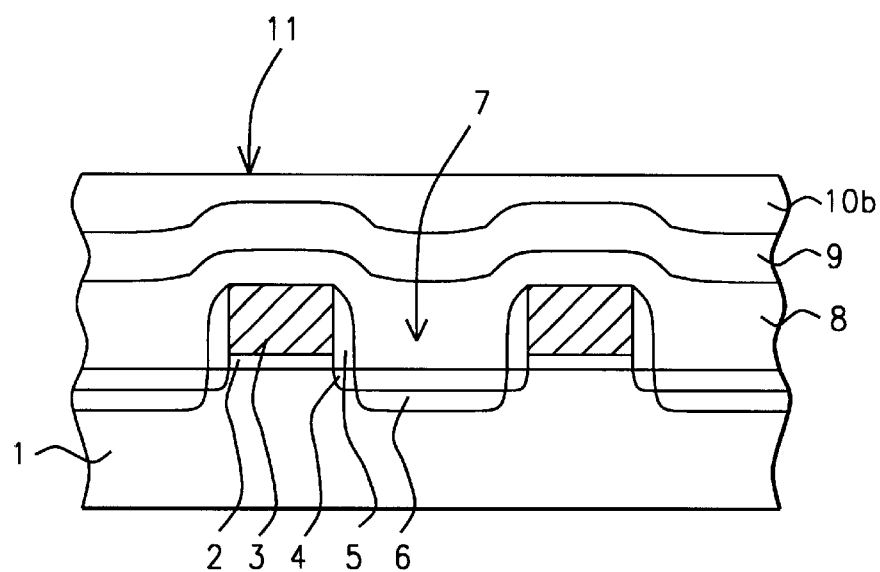

For subsequent wiring procedures, formed on the composite ILD layer, it is advantageous to provide a smooth top surface topography for the composite ILD layer. This can be accomplished via a chemical mechanical polishing, (CMP), procedure, applied to second insulator layer 9. However to avoid excess removal of the vital gettering component of the composite ILD layer, a third insulator layer 10a, is deposited overlying second insulator layer 9, then it is subjected to the CMP planarization procedure. Third insulator layer 10a, shown schematically in FIG. 4, at a thickness between about 3000 to 6000 Angstroms, comprised of undoped silicon glass, is obtained via PECVD procedures, at a temperature between about 350 to 450° C. A CMP procedure is then employed for planarization purposes, resulting in planarized, third insulator layer 10b, shown schematically in FIG. 5. Final composite ILD layer 11, is now comprised with: gap filling, low charge level, first insulator layer 8; gettering, second insulator layer 9; and planarized, third insulator layer 10b.

While this invention has been particularly shown and described with reference to the preferred embodiments thereof, it will be understood by those skilled in the art that various changes in form and details may be made without departing from the spirit or scope of the invention.

What is claimed is:

1. A method of forming a composite, interlevel dielectric, (ILD), layer, on metal oxide semiconductor field effect transistor, (MOSFET), devices, on a semiconductor substrate, comprising the steps of:

providing said MOSFET devices comprised with polysilicon gate structures, on an underlying gate insulator layer, with a space between said polysilicon gate structures;

depositing an undoped, first insulator layer, of said composite ILD layer, on underlying, said MOSFET devices, and filling said space between said polysilicon gate structures;

depositing an unannealed doped, second insulator layer, on said first insulator layer;

depositing an undoped, third insulator layer, on said unannealed second insulator layer; and planarizing the top surface of said third insulator layer.

2. The method of claim 1, wherein said space between said polysilicon gate structures is between about 0.16 to 0.20 um.

3. The method of claim 1, wherein said first insulator layer is an undoped silicon glass, (USG), layer, at a thickness between about 1000 to 2000 Angstroms, obtained via high density plasma, (HDP), deposition procedures, at a temperature between about 500 to 600° C., using silane and oxygen as a source.

4. The method of claim 1, wherein said unannealed second insulator layer is an unannealed phosphosilicate glass, (PSG), layer, at a thickness between about 2000 to 3000 Angstroms, obtained via a deposition procedure chosen from a group that includes: high density plasma, (HDP), plasma enhanced chemical vapor deposition, (PECVD), atmospheric pressure chemical vapor deposition, (APCVD), or sub-atmospheric chemical vapor deposition, (SACVD), deposited at a temperature between about 450 to 600° C., using TEOS, or silane and oxygen, as a source for the $SiO_2$ component.

5. The method of claim 1, wherein said unannealed second insulator layer is a borophosphosilicate glass, (BPSG), layer, at a thickness between about 2000 to 3000 Angstroms, obtained via a deposition procedure chosen from a group that includes: plasma enhanced chemical vapor deposition, (PECVD), atmospheric pressure chemical vapor deposition, (APCVD), or sub-atmospheric chemical vapor deposition, (SACVD), deposited at a temperature between about 450 to 600° C., using TEOS, or silane and oxygen as a source for the $SiO_2$ component.

6. The method of claim 1, wherein said third insulator layer is an undoped silicon glass layer, obtained via PECVD procedures, at a temperature between about 350 to 450° C., to a thickness between about 3000 to 6000 Angstroms.

7. The method of claim 1, wherein said third insulator layer is planarized using a chemical mechanical polishing procedure.

8. A method of fabricating a composite ILD layer, on MOSFET devices, featuring an underlying, undoped first insulator layer, used to fill spaces between MOSFET gate structures, and an overlying, unannealed doped second insulator layer, used to getter mobile ions, comprising the steps of:

providing said MOSFET devices, comprised with polysilicon gate structures, on an underlying gate insulator layer, with a first space between said polysilicon gate structures;

forming insulator spacers on the sides of said polysilicon gate structures, resulting in a second space between said polysilicon gate structures, with said second space narrower in width, than said first space;

depositing said underlying, undoped first insulator layer, of said composite ILD layer, on underlying MOSFET devices, with said underlying, undoped first insulator layer filling said second space, located between said polysilicon gate structures;

depositing said overlying, unannealed doped second insulator layer, on said underlying, doped first insulator layer, with said overlying, unannealed doped second insulator layer doped with $P_2O_5$;

depositing an undoped third insulator layer, on said overlying, unannealed doped second insulator layer; and performing a chemical mechanical polishing procedure to planarize the top surface of said undoped third insulator layer.

9. The method of claim 8, wherein said insulator spacers, on the sides of said polysilicon gate structures, are comprised of silicon oxide, or silicon nitride, at a thickness between about 800 to 1300 Angstroms.

10. The method of claim 8, wherein said second space, located between said polysilicon gate structures, comprised with said insulator spacers, is between about 0.16 to 0.20 um.

11. The method of claim 8, wherein said underlying, undoped first insulator layer is an undoped silicon glass, (USG), layer, at a thickness between about 1000 to 2000 Angstroms, obtained via high density plasma, (HDP), deposition procedures, at a temperature between about 500 to 600° C., using silane and oxygen as a source.

12. The method of claim 8, wherein said overlying, unannealed doped second insulator layer is a phosphosilicate glass, (PSG), layer, at a thickness between about 2000 to 3000 Angstroms, obtained via a deposition procedure chosen from a group that includes: high density plasma, (HDP), plasma enhanced chemical vapor deposition, (PECVD), atmospheric pressure chemical vapor deposition, (APCVD), or sub-atmospheric chemical vapor deposition, (SACVD), deposited at a temperature between about 450 to 600° C., using TEOS, or silane and oxygen, as a source for the $SiO_2$ component, with a weight percent phosphorous between about 3 to 7.

13. The method of claim 8, wherein said overlying, unannealed doped second insulator layer is a borophosphosilicate glass, (BPSG), layer, at a thickness between about 2000 to 3000 Angstroms, obtained via a deposition procedure chosen from a group that includes: plasma enhanced chemical vapor deposition, (PECVD), atmospheric pressure chemical vapor deposition, (APCVD), or sub-atmospheric chemical vapor deposition, (SACVD), deposited at a temperature between about 450 to 600° C., using TEOS, or silane and oxygen, as a source for the $SiO_2$ component, and with a weight percent of phosphorous between about 3 to 7, and with a weight percent of boron between about 2 to 6.

14. The method of claim 8, wherein said undoped third insulator layer is an undoped silicon glass layer, at a thickness between about 3000 to 6000 Angstroms, obtained via PECVD procedures, at a temperature between about 350 to 450° C.

* * * * *